(12) United States Patent
Ogihara

(10) Patent No.: US 8,309,859 B2
(45) Date of Patent: Nov. 13, 2012

(54) METHOD OF MANUFACTURING A SUBSTRATE, SUBSTRATE, DEVICE PROVIDED WITH A SUBSTRATE, AND DETERMINING METHOD

(75) Inventor: Chiho Ogihara, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 444 days.

(21) Appl. No.: 12/461,268

(22) Filed: Aug. 5, 2009

(65) Prior Publication Data

US 2010/0035021 A1    Feb. 11, 2010

(30) Foreign Application Priority Data

Aug. 11, 2008  (JP) ................................. 2008-206606

(51) Int. Cl.
*H05K 1/16* (2006.01)
(52) U.S. Cl. ............................ 174/260; 174/255; 29/832
(58) Field of Classification Search ............... 228/180.1, 228/180.21
See application file for complete search history.

(56) References Cited

U.S. PATENT DOCUMENTS

| | | | | |
|---|---|---|---|---|
| 3,770,874 A | * | 11/1973 | Krieger et al. ................. | 174/257 |
| 5,854,741 A | * | 12/1998 | Shim et al. .................... | 361/813 |
| 7,129,146 B2 | * | 10/2006 | Hsu ................................ | 438/401 |
| 7,566,835 B2 | * | 7/2009 | Yokomaku ..................... | 174/262 |
| 8,046,911 B2 | | 11/2011 | Murayama | |
| 2005/0087364 A1 | * | 4/2005 | Umemoto ...................... | 174/260 |

FOREIGN PATENT DOCUMENTS

| | | |
|---|---|---|
| JP | 10-233572 (A) | 9/1998 |
| JP | 2003-209349 A | 7/2003 |
| JP | 2008-109059 (A) | 5/2008 |

OTHER PUBLICATIONS

Japanese Notification of Reasons for Rejection dated Aug. 14, 2012, with partial English-language translation.

* cited by examiner

*Primary Examiner* — Ishwarbhai Patel
(74) *Attorney, Agent, or Firm* — McGinn IP Law Group, PLLC

(57) ABSTRACT

A substrate includes a base material, a first solder part disposed on a surface of the base material and used for connection to an electronic component, and a second solder part disposed on the surface of the base material and made of the same solder as that of the first solder part. The top surface of the first solder part is made to be a flat surface, and the maximum height of the second solder part from the surface of the base material is lower than the height of the flat surface of the first solder part from the surface of the base material. Thus, a substrate for which the kind of solder can be determined easily and with certainty, a device provided with this substrate, a method of manufacturing the substrate, and a determining method are provided.

13 Claims, 3 Drawing Sheets

METHOD OF MANUFACTURING A SUBSTRATE, SUBSTRATE, DEVICE PROVIDED WITH A SUBSTRATE, AND DETERMINING METHOD

This application is based on Japanese Patent Application No. 2008-206606, the content of which is incorporated hereinto by reference.

BACKGROUND

1. Technical Field

The present invention relates to a method of manufacturing a substrate, a substrate, a device provided with a substrate, and a determining method.

2. Related Art

Conventionally, in connecting a substrate to an electronic component such as a semiconductor chip, a solder is disposed on a substrate surface, whereby the substrate and the semiconductor chip are connected with each other via the solder.

On the other hand, in recent years, a lead-free solder is used as the solder in addition to a lead-containing solder. In accordance with the kind or the like of the device that is mounted on the substrate or the like, a lead-containing solder and a lead-free solder are distinguished to be used. For this reason, it is necessary to determine the kind of solder that is formed on the substrate.

There is a method of confirming the kind of solder by using a fluorescent X-ray; however, this method requires time and labor, and it will be difficult to produce a substrate efficiently.

Thus, a method disclosed in Japanese Patent Application Laid-open (JP-A) No. 2003-209349 is proposed for example.

By this method, a determination land is provided on a substrate surface, and the kind of solder is determined by the spread and protuberance of the solder to this determination land.

When a lead-free solder is used, the decrease in the surface tension is small at the time of heating and melting for reflowing, and the wettability to the determination land is inferior. For this reason, it is assumed that the solder will be thick at the central part to be raised gently.

On the other hand, when a lead-containing solder is used, the surface tension decreases at the time of heating and melting for reflowing, and the wettability to the determination land is good. For this reason, it is assumed that the solder has a flat shape having a uniform thickness.

In JP-A No. 2003-209349, it is assumed that the kind of solder can be determined by the difference in the surface tension at the time of reflowing. However, depending on the kind of lead-free solder or the melting temperature of the lead-free solder, the wettability to the determination land will be good even if a lead-free solder is used, so that the shape of the solder may have a flat shape having a uniform thickness in the same manner as the case of a lead-containing solder.

Therefore, it may be difficult to determine the kind of solder by the technique of JP-A No. 2003-209349.

As a result of studies made by the present inventors, it is found that, whether the solder is a lead-containing solder or a lead-free solder can be determined by the presence or absence of the luster on the solder surface, and can be determined by observing an outer appearance. Generally, a lead-free solder does not have a luster on the surface, whereas a lead-containing solder has a luster on the surface.

However, the solder formed on the substrate surface may be subjected to surface flattening (a coining treatment) because an electronic component such as a semiconductor chip may be disposed on this solder. The coining treatment is carried out by pressing the flat surface of a coining tool onto the solder surface, whereby the solder surface is flattened.

When the solder surface is subjected to a coining treatment in this manner, the solder surface may be damaged, and it will be difficult to determine the kind of solder by the outer appearance of the solder.

SUMMARY

In one embodiment, there is provided a method of manufacturing a substrate, including forming a first solder part and a second solder part made of the same kind of solder as that of the first solder part on one surface of a base material, and flattening only the first solder part among the first solder part and the second solder part.

In this invention, only the first solder part is flattened.

By this, the second solder part surface is not subjected to a treatment for flattening the surface, whereby the second solder part surface is prevented from being damaged by the flattening. For this reason, the kind of solder of the first solder part can be determined by observing the second solder part surface.

Therefore, the kind of solder can be determined easily and with certainty.

In another embodiment, there is provided a substrate produced by the aforementioned production method.

Specifically, there is provided a substrate including a base material, a first solder part disposed on one surface of the base material and used for connection to an electronic component, and a second solder part disposed on the one surface of the base material and made of the same kind of solder as that of the first solder part, wherein a surface of the first solder part opposite to a surface facing the base material is made to be a flat surface, and a maximum height of the second solder part from the one surface of the base material is lower than a height of the flat surface of the first solder part from the one surface of the base material.

Here, the flat surface refers to a surface being generally parallel to the one surface of the base material.

In another embodiment, there is provided a device including a substrate described above and an electronic component connected to the first solder part of the substrate via a solder.

In another embodiment, there is provided a determining method of determining the kind of solder of the first solder part by observing an outer appearance of the second solder part with use of a substrate described above.

In still another embodiment, there are provided a method of manufacturing a substrate, a substrate, a device provided with the substrate, and a determining method that can determine the kind of solder easily and with certainty.

BRIEF DESCRIPTION OF THE DRAWINGS

The above and other objects, advantages, and features of the present invention will be more apparent from the following description of certain preferred embodiments taken in conjunction with the accompanying drawings, in which.

DETAILED DESCRIPTION OF THE INVENTION

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereafter, an embodiment of the present invention will be described with reference to the attached drawings.

Figure 1:
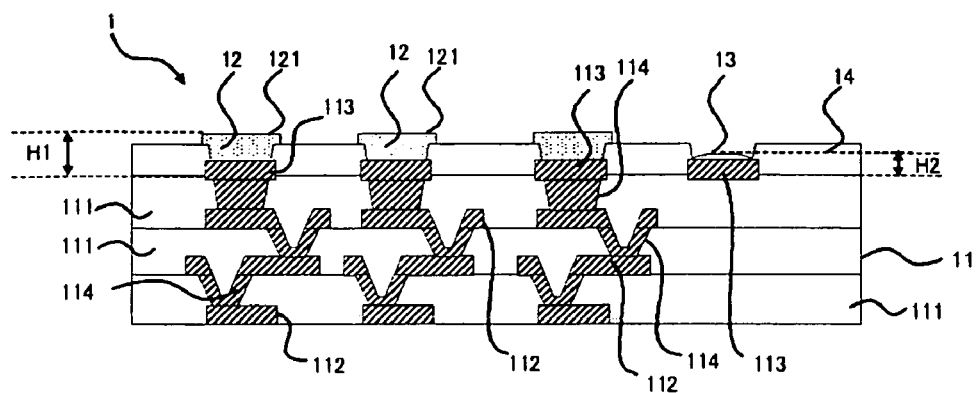
FIG. 1 is a cross-sectional view of a substrate according to one embodiment of the present invention.

First, with reference to FIG. 1, an outline of a substrate 1 of the present embodiment will be described.

This substrate 1 includes a base material 11, a first solder part 12 disposed on one surface of the base material 11 and used for connection to an electronic component, and a second solder part 13 disposed on the one surface of the base material 11 (the surface of the base material 11 on which the electronic component is mounted) and made of the same solder as that of the first solder part 12.

The top surface of the first solder part 12 (the surface opposite to the surface facing the base material 11 surface) is made to be a flat surface 121, and the second solder part 13 surface is not subjected to a coining treatment for flattening the surface. The maximum height H2 of the second solder part 13 from the base material 11 surface is lower than the maximum height H1 of the flat surface 121 of the first solder part 12 from the base material 11 surface.

Here, the coining treatment is a treatment for flattening a solder surface by pressing the solder surface with a coining tool or the like.

Figure 2:
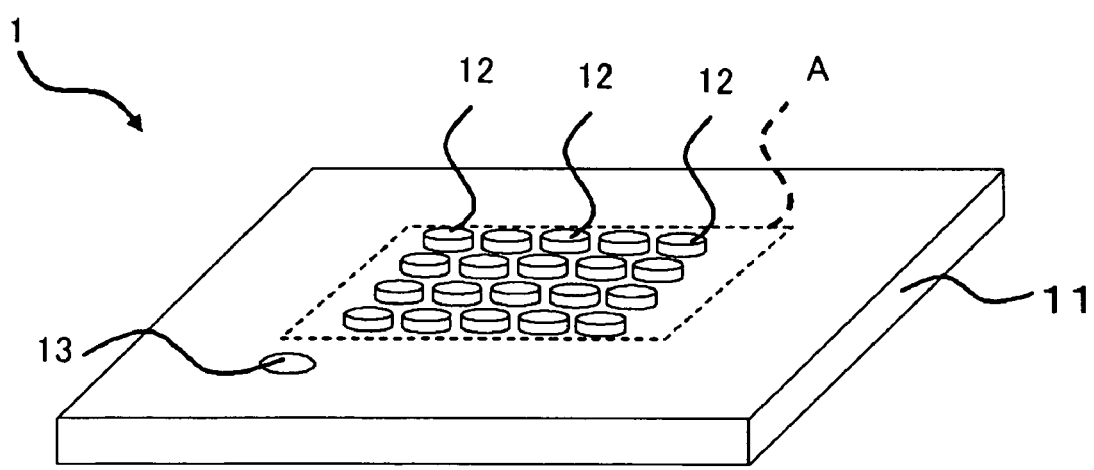
FIG. 2 is a perspective view showing the substrate.

Next, with reference to FIGS. 1 and 2, the substrate 1 will be described in detail.

Figure 3:
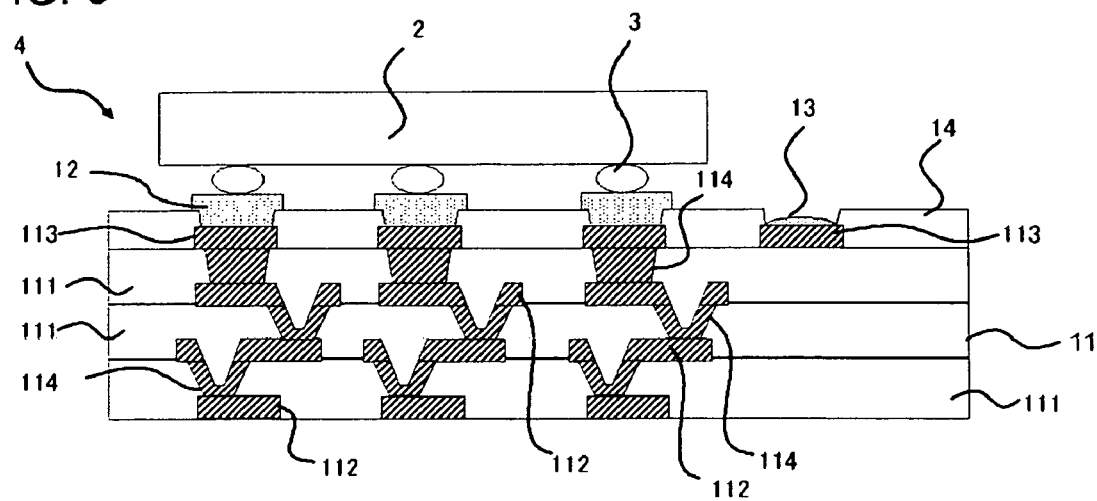
FIG. 3 is a cross-sectional view of a semiconductor device.

The substrate 1 is for mounting a semiconductor chip 2 (electronic component) on the surface thereof by flip chip mounting (See FIG. 3).

This substrate 1 has a build-up substrate part 11, which is a wiring substrate part, as the base material 11.

The build-up substrate part 11 is obtained by laminating an insulating layer 111 containing resin and a conductor wiring layer 112 alternately. A conductor layer 114 is formed within a hole formed in the insulating layer 111, so as to connect the conductor wiring layers 112 each other that are arranged to sandwich the insulating layer 111.

On the uppermost insulating layer 111 of such a build-up substrate part 11, a plurality of lands 113 made of conductor layers are arranged. The land 113 is connected to the conductor wiring layer 112 via a conductor layer 114 formed within the insulating layer 111.

The conductor wiring layer 112, the land 113, and the conductor layer 114 are all made of metal, and are constructed to contain copper or the like, for example.

Also, a solder resist (cover film) 14 is disposed on the insulating layer 111 on which the lands 113 are provided. In the solder resist 14, a plurality of openings corresponding to the positions of the lands 113 are formed. The size of the openings of the solder resist 14 is smaller than the size of the lands 113. Also, the plurality of openings of the solder resist 14 all have the same size and same form, and the lands 113 that are exposed from the respective openings of the solder resist all have the same area.

The first solder part 12 is placed on the land 113 disposed in a semiconductor chip mounting region A among the plurality of lands 113.

Here, the semiconductor chip mounting region A refers to a region that is covered with a semiconductor chip 2 as viewed from the substrate 1 surface side when the semiconductor chip 2 is mounted.

The first solder part 12 completely covers the land 113 that is exposed from the opening of the solder resist 14, and protrudes upwards (opposite to the base material 11) from the opening of the solder resist 14. Further, the top surface of the first solder part 12 is made to be a flat surface 121 that is generally parallel to the base material 11 surface. This flat surface 121 is located above the solder resist 14 surface. The flat surface 121 is formed by performing a coining treatment on the solder.

The kind of solder of the first solder part 12 is not particularly limited, and may be either a lead-containing solder or a lead-free solder.

As shown in FIG. 3, a semiconductor chip 2 is mounted on this first solder part 12 via a solder bump 3. In order to enhance the mounting stability of this semiconductor chip 2, the top surface of the first solder part 12 is made to be a flat surface 121. This first solder part 12 is what is known as a preliminary solder.

On the other hand, the second solder part 13 is disposed on the land 113 that is located outside of the semiconductor chip mounting region A among the plurality of lands 113.

Here, the second solder part 13 may be either disposed only on one land 113 or disposed on a plurality of lands 113.

The land 113 on which the second solder part 13 is disposed is placed in a neighborhood of the semiconductor chip mounting region A.

This second solder part 13 completely covers the land 113 surface that is exposed from the opening of the solder resist 14. This second solder part 13 does not protrude from the opening of the solder resist 14, and the surface thereof is positioned more to the base material 11 side than the solder resist 14 surface (the surface opposite to the surface on the base material 11 side).

The maximum height H2 of the second solder part 13 from the base material 11 surface is lower than the height H1 of the flat surface 121 of the first solder part 12 from the base material 11 surface.

The surface of the second solder part 13 is arched and protrudes to the side opposite to the base material 11 surface. In other words, the second solder part 13 is not subjected to a coining treatment.

The kind of solder of the second solder part 13 may be any one as long as it is the same as that of the first solder part 12.

As shown in FIG. 3, a semiconductor chip 2 is mounted on the substrate 1 such as described above. This semiconductor chip 2 is connected to the first solder part 12 via a solder bump 3. This constitutes a semiconductor device 4 having the semiconductor chip 2 and the substrate 1.

Next, with reference to FIGS. 4 and 5, a method of manufacturing a substrate 1 such as described above will be described.

First, an outline of the method of manufacturing the substrate 1 will be described.

A method of manufacturing a substrate 1 includes applying a solder on a base material 11 so as to form a first solder part 12 and a second solder part 13 such that the maximum height of the second solder part 13 from the base material 11 surface is lower than the maximum height of the first solder part 12 from the base material 11 surface and which is made of the same kind of solder as that of the first solder part 12, and flattening the first solder part 12 surface by pressing the first solder part 12 surface.

In flattening the first solder part 12 surface by pressing the first solder part 12 surface, the second solder part 13 surface is not pressed, but the first solder part 12 surface is pressed so that the height of the flat surface 121 of the first solder part 12 from the base material 11 surface is larger than a maximum height of the second solder part 13 from the base material 11 surface. Then, after flattening the first solder part 12 surface by pressing the first solder part 12 surface, the kind of solder of the first solder part 12 is determined by observing the outer appearance of the second solder part 13.

Next, a method of manufacturing the substrate 1 will be described in detail.

First, a solder resist 14 is disposed on a base material 11.

Figure 4:
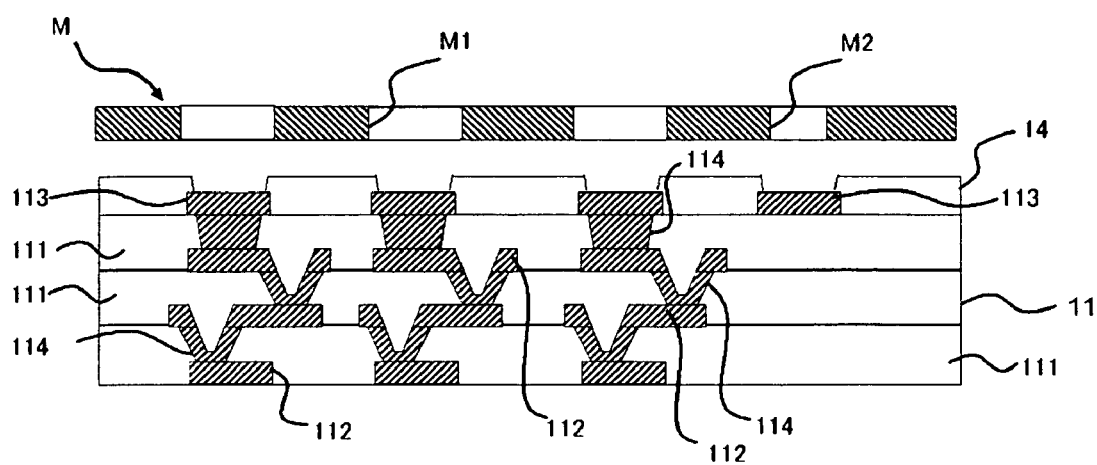
FIG. 4 is a cross-sectional view showing steps of manufacturing the substrate.
Figure 5:
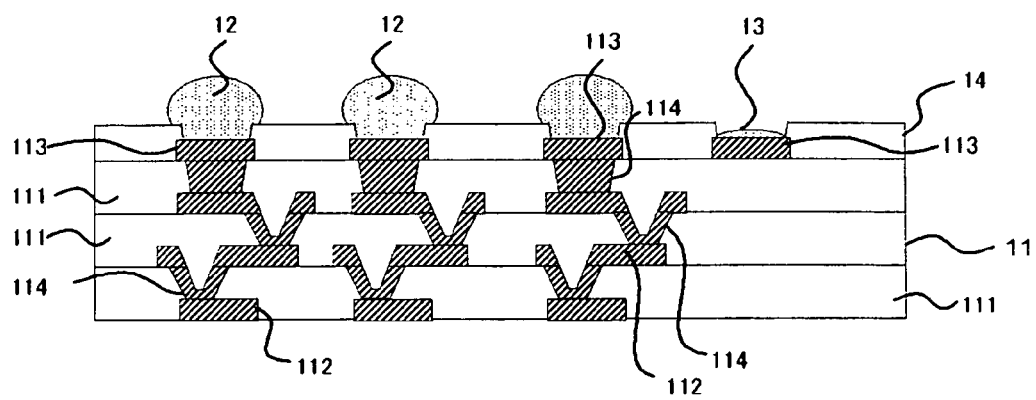
FIG. 5 is a cross-sectional view showing steps of manufacturing the substrate.

Next, as shown in FIG. 4, a mask M having a plurality of openings M1, M2 formed therein is disposed on the solder resist 14.

This mask M is a mask for printing the first solder part 12 and the second solder part 13.

The opening M2 is formed to have a smaller area than the opening M1. Specifically, the area of the opening M1 located on the land 113 located in the semiconductor chip mounting region A is larger than the area of the opening M2 located on the land 113 located outside of the semiconductor chip mounting region A.

Next, solder is applied onto the mask M. The solder is applied onto the lands 113 of the base material 11 via the openings M1, M2 of the mask M and further via the solder resist 14.

Since the sizes of the openings M1, M2 of the mask M are different from each other, the amount of solder on the land 113 located in the semiconductor chip mounting region A is larger than the amount of solder on the land 113 located outside of the semiconductor chip mounting region A.

Next, the mask M is removed from the base material 11, and the base material 11 on which the solder has been applied is subjected to a reflowing treatment. After reflowing, as shown in FIG. 5, the first solder part 12 on the land 113 located in the semiconductor chip mounting region A and the second solder part 13 on the land 113 located outside of the semiconductor chip mounting region A all have a surface that is arched and curved.

However, since the amount of solder on the land 113 located in the semiconductor chip mounting region A is larger than the amount of solder on the land 113 located outside of the semiconductor chip mounting region A, the top of the first solder part 12 on the land 113 located in the semiconductor chip mounting region A is positioned above (more to the side opposite to the base material 11 than) the top of the second solder part 13 on the land 113 located outside of the semiconductor chip mounting region A.

Also, the surface of the second solder part 13 does not protrude from the opening of the solder resist 14, and is positioned more to the base material 11 side than the solder resist 14 surface. On the other hand, the surface of the first solder part 12 protrudes from the opening of the solder resist 14, and is positioned more to the opposite side of the base material 11 than the solder resist 14 surface.

Next, a coining treatment of the first solder part 12 on the land 113 in the semiconductor chip mounting region A is carried out.

Specifically, from the base material 11 surface side, a coining tool having a flat pressing surface is pressed onto the base material 11, so as to make the surface of the first solder part 12 be a flat surface. In this manner the first solder part 12 is formed.

At this time, since the top of the second solder part 13 on the land 113 located outside of the semiconductor chip mounting region A is positioned below (more to the base material 11 side than) the top of the first solder part 12 on the land 113 located in the semiconductor chip mounting region A, the second solder part 13 on the land 113 located outside of the semiconductor chip mounting region A is not subjected to a coining treatment.

The maximum height of the second solder part 13 from the base material 11 surface is lower than the height of the flat surface 121 of the first solder part 12 from the base material 11 surface.

Next, the kind of solder of the first solder part 12 is determined by observing an outer appearance of the second solder part 13. Specifically, whether the solder of the first solder part 12 is a lead-containing solder or a lead-free solder is determined by the presence or absence of luster on the second solder part 13. Then, whether the solder is a desired kind or not is confirmed.

By the above process, the production of the substrate 1 is completed.

Thereafter, a semiconductor chip 2 is mounted onto the substrate 1 to obtain a semiconductor device 4. Specifically, the semiconductor chip 2 is mounted onto the flat surface 121 of the first solder part 12 via a solder bump 3. Then, the substrate 1 and the semiconductor chip 2 are reflowed to connect the substrate 1 and the semiconductor chip 2 with each other.

Next, the second solder part 13 is observed, and whether the second solder part 13 has gone under the solder resist 14 is confirmed. When the second solder part 13 has gone under the solder resist 14, it appears that the first solder part 12 also has gone under the solder resist 14.

In this case, the first solder parts 12 may be connected with each other below the solder resist 14, thereby causing poor electric conduction.

Therefore, when the second solder part 13 has gone under the solder resist 14, it is determined that the semiconductor device 4 is poor.

On the other hand, when the second solder part 13 has not gone under the solder resist 14, it is determined that a normal semiconductor device 4 is obtained.

Next, the functions and effects of the present embodiment will be described.

The second solder part 13 is made of the same kind of solder as that of the first solder part 12, and the second solder part 13 surface is not subjected to a coining treatment for flattening the surface. For this reason, the second solder part 13 surface is not damaged by the coining treatment, and the kind of the solder of the first solder part 12 can be determined by observing a surface of the second solder part 13.

Therefore, a substrate 1 can be provided in which the kind of the solder can be determined easily and with certainty.

Also, some openings M2 of the mask M for printing the solder are made smaller than the other openings M1. For this reason, the amount of solder applied at the positions of some openings M2 is smaller than the amount of solder applied at the positions of other openings M1. Due to this, after the reflowing treatment, the position of the solder surface applied at the position of the other openings M1 can be made lower than the position of the solder (second solder part 13) surface applied at the position of some openings M2. Therefore, in forming the first solder part 12 by performing the coining treatment, it is easy to prevent the coining treatment from being performed on the second solder part 13 surface.

Further, in the present embodiment, the second solder part 13 does not protrude from the opening of the solder resist 14, and the surface thereof is positioned more to the base material 11 side than the solder resist 14 surface. On the other hand, the solder constituting the first solder part 12 protrudes from the solder resist 14 surface to the side opposite to the base material 11.

By this, in forming a flat surface 121 on the first solder part 12, the second solder part 13 can be certainly prevented from being subjected to a coining treatment.

Also, in the present embodiment, the second solder part 13 is disposed outside of the chip mounting region A of the base material 11. This can prevent the chip mounting region A of the base material 11 from being narrowed.

Also, since the second solder part 13 is disposed outside of the chip mounting region A of the base material 11, the second solder part 13 can be observed in a state in which the semiconductor chip 2 is mounted on the substrate 1.

Specifically, whether the first solder part 12 in the chip mounting region A has gone under the solder resist 14 can be determined by observing whether the second solder part 13 has gone under the solder resist 14.

Generally, the solder resist 14 does not have a good close adhesion property to the land 113, so that the land 113 and the solder resist 14 may be exfoliated from each other, and the solder may go under the solder resist 14.

Conventionally, in order to determine whether the solder has gone under the solder resist, the semiconductor chip is peeled off to perform the confirmation. However, in the present embodiment, since the second solder part 13 is provided, there is no need to peel off the semiconductor chip 2.

This enhances the productivity of the semiconductor device 4.

Further, in the present embodiment, the land 113 on which the second solder part 13 is disposed is placed in a neighborhood of the semiconductor chip mounting region A.

The going of the solder under the solder resist 14 often occurs in joining the semiconductor chip 2 with a solder bump 3 and, during this time, heat is applied to the substrate 1.

By placing the second solder part 13 in a neighborhood of the semiconductor chip mounting region A, heat generally similar to the one applied to the first solder part 12 is applied to the second solder part 13.

Therefore, by observing the second solder part 13, the state of the first solder part 12 can be grasped with certainty.

Here, when a plurality of second solder parts 13 are provided, the determination of the solder and the determination of the defect occurrence of the solder going into the solder resist 14 can be performed more accurately.

(Modification)

Here, the present invention is not limited to the above-described embodiments, so that a modification, an improvement, and the like are all comprised within the scope of the present invention as long as the object of the present invention is achieved.

For example, in the aforementioned embodiment, the solder resist 14 is disposed on the base material 11. However, the present invention is not limited to this, so that the solder resist 14 may be absent. Further, in place of the solder resist 14, an insulating layer similar to the insulating layer of the base material 11 may be disposed on the base material 11 as a cover film.

Furthermore, in the aforementioned embodiment, the second solder part 13 surface is located more to the base material 11 side than the solder resist 14 surface. However, the present invention is not limited to this alone, so that the second solder part 13 may protrude from the opening of the solder resist 14 in the same manner as the first solder part 12.

Also, in the aforementioned embodiment, the base material 11 is made of a build-up substrate part; however, the base material 11 is not limited to this alone, so that it may be any one as long as it is a wiring substrate or the like.

(Reference Mode)

The first solder part surface may not be subjected to a coining treatment. When the first solder part surface is generally flat, the coining treatment is not necessary.

Also, in a case in which the first solder part surface is not subjected to the coining treatment, the second solder part surface may be at a position above the first solder part surface.

Namely, there may be provided a substrate including a base material, a first solder part disposed on a surface of the base material and used for connection to an electronic component, and a second solder part disposed on the surface of the base material and made of the same kind of solder as that of the first solder part. A top surface of the second solder part may not be subjected to a coining treatment for flattening the top surface.

It is apparent that the present invention is not limited to the above embodiment, and may be modified and changed without departing from the scope and spirit of the invention.

What is claimed is:

1. A substrate comprising:
   a base material, the base material comprising a plurality of insulating layers each comprising a plurality of pads disposed on a top surface thereof;
   a first solder part disposed on a first of the plurality of the pads on an uppermost insulating layer of the plurality of the insulating layers of said base material and used for connection to an electronic component; and
   a second solder part disposed on a second on the plurality of the pads on the uppermost insulating layer of said base material and outside of the electronic component mounting region of the substrate, the second solder part being made of a same kind of solder as that of said first solder part,
   wherein a surface of said first solder part opposite to a surface facing said base material is made to be a flat surface, and a maximum height of said second solder part from the uppermost insulating layer of said base material is lower than a height of said flat surface of said first solder part from the uppermost insulating layer of said base material,
   wherein the second solder part includes an uppermost surface that is below an uppermost surface of a cover film disposed on the uppermost insulating layer of the base material, and
   wherein the first solder part includes an uppermost surface that is above the uppermost surface of the cover film.

2. The substrate according to claim 1, wherein said second solder part is for determining the kind of solder of said first solder part.

3. The substrate according to claim 1, wherein a surface of said second solder part is arched to protrude toward a side opposite to the uppermost insulating layer of said base material.

4. The substrate according to claim 1, wherein the cover film disposed on the uppermost insulating layer of said base material has openings formed therein at which said first solder part and said second solder part are exposed,
   wherein a surface of said second solder part is located more to a surface of said cover film on the uppermost insulating layer of said base material than a surface of said cover film opposite to the surface on the uppermost insulating layer of said base material, and
   wherein the flat surface of said first solder part is located more to the surface of said covet film opposite to the surface on the uppermost insulating layer of said base material than the surface of said cover film on the uppermost insulating layer of said base material.

5. The substrate according to claim 4, wherein the opening of said cover film at which said first solder part is exposed and the opening of said cover film at which said second solder part is exposed have the same size and shape.

6. The substrate according to claim 1, wherein the second solder part is one of a plurality of second solder parts.

7. The substrate according to claim 1, wherein the cover film has an opening,
wherein the second solder part is disposed in the opening of the cover film, and
wherein the uppermost portion of the second solder part is below an uppermost portion of the opening of the cover film.

8. The substrate according to claim 1, wherein the electronic component is connected to the first solder part via a solder bump.

9. A substrate comprising:
a base material, the base material comprising a plurality of insulating layers each comprising a plurality of pads disposed on a top surface thereof;
a first solder part disposed on a first of the plurality of the pads on an uppermost insulating layer of the plurality of insulating layers of said base material and within an electronic component mounting region of the substrate, the first solder part being used for connection to an electronic component; and
a second solder part disposed on a second of the plurality of the pads on the uppermost insulating layer of the base material and outside of the electronic component mounting region of the substrate, the second solder part comprising a material which comprises a same kind of solder as a material of the first solder part,
wherein the second solder part includes an uppermost surface that is below a top surface of a cover film disposed on the uppermost insulating layer of the base material,
wherein the first solder part includes an uppermost surface that is above the top surface of the cover film, and
wherein the first solder part is arranged in a first opening of the cover film and the second solder part is arranged in a second opening of the cover film.

10. A device comprising the substrate according to claim 9, wherein the electronic component is connected to the first solder part via a solder bump.

11. The device according to claim 10,
wherein the first opening and the second opening have a same form and size.

12. A device comprising:
the substrate according of claim 1; and
an electronic component connected to said first solder part of said substrate via a solder.

13. A determining method of determining a kind of solder of said first solder part by observing an outer appearance of said second solder part with use of the substrate according to claim 1.

* * * * *